United States Patent
Oberlander

(10) Patent No.: US 7,754,414 B2
(45) Date of Patent: Jul. 13, 2010

(54) ANTIREFLECTIVE COATING COMPOSITIONS

(75) Inventor: Joseph E. Oberlander, Phillipsburg, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 472 days.

(21) Appl. No.: 11/456,868

(22) Filed: Jul. 12, 2006

(65) Prior Publication Data

US 2008/0014529 A1    Jan. 17, 2008

(51) Int. Cl.
*G03C 1/00* (2006.01)
*G03F 1/00* (2006.01)

(52) U.S. Cl. ..................... 430/270.1; 430/330

(58) Field of Classification Search ............... 430/273.1, 430/270.1, 330
See application file for complete search history.

(56) References Cited

U.S. PATENT DOCUMENTS

| 6,033,830 | A | 3/2000 | Sinta et al. | |
|---|---|---|---|---|
| 6,876,017 | B2 * | 4/2005 | Goodner | 257/254 |
| 2003/0008237 | A1 * | 1/2003 | Pavelchek et al. | 430/271.1 |
| 2004/0058271 | A1 | 3/2004 | Endo et al. | |
| 2005/0112494 | A1 | 5/2005 | Yao et al. | |
| 2005/0214674 | A1 * | 9/2005 | Sui et al. | 430/270.1 |
| 2007/0099108 | A1 * | 5/2007 | Abdallah et al. | 430/270.1 |

FOREIGN PATENT DOCUMENTS

| WO | WO 2005/093513 A | 10/2005 |
|---|---|---|
| WO | WO2005/093513 A2 | 10/2005 |
| WO | WO2005/093513 A3 | 10/2005 |
| WO | WO2006/067944 | 6/2006 |

OTHER PUBLICATIONS

M. Shirai and M. Tsunooka, Photoacid and photobase generators: Chemistry and applications to polymeric materials, Prog. Polym. Sci., vol. 21, 1-45 (1996).
Notification of Transmittal of the International Search Report and the Written Opinion of the International Searching Authority, or the Declaration (PCT/ISA/220) for corresponding PCT Application of the captioned application.
International Search Report (PCT/ISA/210) for corresponding PCT Application of the captioned application.
Written Opinion of the International Searching Authority (PCT/ISA/237) for corresponding PCT Application of the captioned application.
Notification Concerning Transmittal of International Preliminary Report on Patentability (Chapter 1 of the Patent Cooperation Treaty) (Form PCT/IB/326), International Preliminary Report on Patentabality (Chapter 1 of the Patent Cooperation Treaty) (Form PCT/IB/373), and Written Opinion of the Searching Authority (Form PCT/ISA/237) for PCT/IB2007/002067.

* cited by examiner

*Primary Examiner*—Cynthia H Kelly
*Assistant Examiner*—Connie P Johnson
(74) *Attorney, Agent, or Firm*—Alan Kass; Sangya Jain

(57) ABSTRACT

Antireflective coating compositions with reduced outgassing are disclosed.

4 Claims, No Drawings

ANTIREFLECTIVE COATING COMPOSITIONS

FIELD OF INVENTION

The present invention relates to novel antireflective coating compositions and their use in image processing by forming a thin layer of the novel antireflective coating composition between a reflective substrate and a photoresist coating. Such compositions are particularly useful in the fabrication of semiconductor devices by photolithographic techniques, especially those requiring exposure with deep ultraviolet radiation.

BACKGROUND

Photoresist compositions are used in microlithography processes for making miniaturized electronic components such as in the fabrication of computer chips and integrated circuits. Generally, in these processes, a thin coating of a film of a photoresist composition is first applied to a substrate material, such as silicon wafers used for making integrated circuits. The coated substrate is then baked to evaporate any solvent in the photoresist composition and to fix the coating onto the substrate. The baked and coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist.

There are two types of photoresist compositions, negative-working and positive-working. When positive-working photoresist compositions are exposed image-wise to radiation, the areas of the photoresist composition exposed to the radiation become soluble in a developer solution (e.g. a rearrangement reaction occurs) while the unexposed areas of the photoresist coating remain relatively insoluble to such a solution. Thus, treatment of an exposed positive-working photoresist with a developer causes removal of the exposed areas of the photoresist coating and the formation of a positive image in the coating, thereby uncovering a desired portion of the underlying substrate surface on which the photoresist composition was deposited. In a negative-working photoresist the developer removes the portions that are not exposed.

The trend towards the miniaturization of semiconductor devices has led both to the use of new photoresists that are sensitive to lower and lower wavelengths of radiation, and also to the use of sophisticated multilevel systems to overcome difficulties associated with such miniaturization.

High resolution, chemically amplified, deep ultraviolet (100-300 nm) positive and negative tone photoresists are available for patterning images with less than quarter micron geometries. There are two major deep ultraviolet (uv) exposure technologies that have provided significant advancement in miniaturization, and these are lasers that emit radiation at 248 nm and 193 nm. Examples of such photoresists are given in the following patents and incorporated herein by reference, U.S. Pat. Nos. 4,491,628, 5,350,660, EP 794458 and GB 2320718. Photoresists for 248 nm have typically been based on substituted polyhydroxystyrene and its copolymers. On the other hand, photoresists for 193 nm exposure require non-aromatic polymers, since aromatics are opaque at this wavelength. Generally, alicyclic hydrocarbons are incorporated into the polymer to replace the etch resistance lost by eliminating the aromatic functionality. Furthermore, at lower wavelengths the reflection from the substrate becomes increasingly detrimental to the lithographic performance of the photoresist. Therefore, at these wavelengths antireflective coatings become critical.

The use of highly absorbing antireflective coatings in photolithography is a simpler approach to diminish the problems that result from back reflection of light from highly reflective substrates. Two major disadvantages of back reflectivity are thin film interference effects and reflective notching. Thin film interference, or standing waves, result in changes in critical line width dimensions caused by variations in the total light intensity in the resist film as the thickness of the resist changes. Reflective notching becomes severe as the photoresist is patterned over substrates containing topographical features, which scatter light through the photoresist film, leading to line width variations, and in the extreme case, forming regions with complete photoresist loss.

The use of bottom antireflective coatings provides the best solution for the elimination of reflectivity. The bottom antireflective coating is applied on the substrate and then a layer of photoresist is applied on top of the antireflective coating. The photoresist is exposed imagewise and developed. The antireflective coating in the exposed area is then typically etched and the photoresist pattern is thus transferred to the substrate.

SUMMARY OF THE INVENTION

The present invention relates to an antireflective coating composition comprising (a) a polymer comprising one or more functional groups capable of one or more interactions selected from the group consisting of covalent bonding, ionic bonding, and hydrogen bonding; and (b) a thermal acid generator which upon heating disassociates into constituent parts that are capable of one or more interactions selected from the group consisting of covalent bonding, ionic bonding, and hydrogen bonding. Upon heating the antireflective coating composition to form an antireflective coating film, the constituent parts of the thermal acid generator become bound to the functional groups of the polymer through the interactions, reducing outgassing from the antireflective coating film.

The present invention also relates to a method for reducing outgassing from an antireflective coating film comprising applying to a substrate a antireflective coating composition comprising (a) a polymer comprising one or more functional groups capable of one or more interactions selected from the group consisting of covalent bonding, ionic bonding, and hydrogen bonding; and (b) a thermal acid generator which upon heating disassociates into constituent parts that are capable of one or more interactions selected from the group consisting of covalent bonding, ionic bonding, and hydrogen bonding; and heating the antireflective coating composition to form an antireflective coating film on the substrate, the constituent parts of the thermal acid generator becoming bound to the functional groups of the polymer through the interactions, reducing outgassing from the antireflective coating film.

The present invention also relates to a coated substrate comprising: a substrate having thereon: an antireflective coating film of the antireflective coating composition comprising (a) a polymer comprising one or more functional groups capable of one or more interactions selected from the group consisting of covalent bonding, ionic bonding, and hydrogen bonding; and (b) a thermal acid generator which upon heating disassociates into constituent parts that are capable of one or more interactions selected from the group consisting of covalent bonding, ionic bonding, and hydrogen bonding.

DETAILED DESCRIPTION OF THE INVENTION

The present invention relates to an antireflective coating composition comprising (a) a polymer comprising one or more functional groups capable of one or more interactions selected from the group consisting of covalent bonding, ionic bonding, and hydrogen bonding; and (b) a thermal acid generator which upon heating disassociates into constituent parts that are capable of one or more interactions selected from the group consisting of covalent bonding, ionic bonding, and hydrogen bonding. Upon heating the antireflective coating composition to form an antireflective coating film, the constituent parts of the thermal acid generator become bound to the functional groups of the polymer through the interactions, reducing outgassing from the antireflective coating film.

The present invention also relates to a method for reducing outgassing from an antireflective coating film comprising applying to a substrate a antireflective coating composition comprising (a) a polymer comprising one or more functional groups capable of one or more interactions selected from the group consisting of covalent bonding, ionic bonding, and hydrogen bonding; and (b) a thermal acid generator which upon heating disassociates into constituent parts that are capable of one or more interactions selected from the group consisting of covalent bonding, ionic bonding, and hydrogen bonding; and heating the antireflective coating composition to form an antireflective coating film on the substrate, the constituent parts of the thermal acid generator becoming bound to the functional groups of the polymer through the interactions, reducing outgassing from the antireflective coating film.

The present invention also relates to a coated substrate comprising: a substrate having thereon: an antireflective coating film of the antireflective coating composition comprising (a) a polymer comprising one or more functional groups capable of one or more interactions selected from the group consisting of covalent bonding, ionic bonding, and hydrogen bonding; and (b) a thermal acid generator which upon heating disassociates into constituent parts that are capable of one or more interactions selected from the group consisting of covalent bonding, ionic bonding, and hydrogen bonding.

The polymers that are used in the antireflective coating composition can be those which are known to those skilled in the art. Examples of such polymers can be found in, for example, U.S. Pat. Nos. 5,294,680, 5,652,317, 6,165,697, and 6,114,085, which disclose polymers which absorb at wavelengths such as 436 nm, 365 nm, 248 nm, and 193 nm, all of which are incorporated herein by reference. Typically, the polymers will contain at least one monomer is selected from optionally substituted acrylic esters, optionally substituted acrylic acids, optionally substituted methacrylic esters, optionally substituted methacrylic acids, optionally substituted acrylamides, optionally substituted methacrylamides, optionally substituted allyl compounds, optionally substituted styrenes, optionally substituted hydroxystyrene, optionally substituted hydroxyisopropylstyrene, optionally substituted methylstyrene, optionally substituted hydroxymethylstyrene, optionally substituted hydroxyl-.alpha.-methylstyrene, optionally substituted vinyl ethers, optionally substituted vinyl esters, optionally substituted crotonic acids, optionally substituted crotonic acid esters, optionally substituted maleic anhydride, optionally substituted dialkyl itaconates, optionally substituted monoalkyl or dialkyl esters of maleic acid or fumaric acid, and mixtures thereof, as well as the monomers described in the aforementioned U.S. patents referenced above. The polymers will sometimes contain additional units that are chromophores at different wavelengths. Examples of chromophores are monocyclice or polycyclic hydrocarbon or heterocyclic units, such as, for example, include optionally substituted phenyl, optionally substituted phenanthryl, optionally substituted anthracyl, optionally substituted acridine, optionally substituted naphthyl, optionally substituted quinolinyl and ring-substituted quinolinyls such as hydroxyquinolinyl groups. contain a resin that has phenyl chromophore units.

Polymers typically used in antireflective compositions of the invention will have a weight average molecular weight (Mw) of about 1,000 to about 10,000,000 daltons, more typically about 5,000 to about 1,000,000 daltons, and a number average molecular weight (Mn) of about 500 to about 1,000,000 daltons. Molecular weights (either Mw or Mn) of the polymers of the invention are suitably determined by gel permeation chromatography.

Also part of the antireflective coating composition is a crosslinker component. Some examples of crosslinking agents include aminoplasts such as, for example, glycoluril-formaldehyde resins, melamine-formaldehyde resins, benzoguanamine-formaldehyde resins, and urea-formaldehyde resins. The use of methylated and/or butylated forms of these resins is highly preferred for obtaining long storage life (3-12 months) in catalyzed form. Highly methylated melamine-formaldehyde resins having degrees of polymerization less than two are useful. Monomeric, methylated glycoluril-formaldehyde resins are useful for preparing thermosetting polyester anti-reflective coatings which can be used in conjunction with acid-sensitive photoresists. One example is N,N,N,N-tetra(alkoxymethyl)glycoluril. Examples of N,N,N,N-tetra(alkoxymethyl)glycoluril, may include, e.g., N,N,N,N-tetra(methoxymethyl)glycoluril, N,N,N,N-tetra(ethoxymethyl)glycoluril, N,N,N,N-tetra(n-propoxymethyl) glycoluril, N,N,N,N-tetra(t-propoxymethyl)glycoluril, N,N,N,N-tetra(n-butoxymethyl)glycoluril and N,N,N,N-tetra(t-butoxymethyl)glycoluril. N,N,N,N-tetra(methoxymethyl) glycoluril is available under the trademark POWDERLINK from Cytec Industries (e.g., POWDERLINK 1174). Other examples include methylpropyltetramethoxymethyl glycoluril, and methylphenyltetramethoxymethyl glycoluril.

Other aminoplast crosslinking agents are commercially available from Cytec Industries under the trademark CYMEL and from Monsanto Chemical Co. under the trademark RESIMENE. Condensation products of other amines and amides can also be employed, for example, aldehyde condensates of triazines, diazines, diazoles, guanidines, guanimines and alkyl- and aryl-substituted derivatives of such compounds, including alkyl- and aryl-substituted melamines. Some examples of such compounds are N,N'-dimethyl urea, benzourea, dicyandiamide, formaguanamine, acetoguanamine, ammeline, 2-chloro-4,6-diamino-1,3,5-triazine, 6-methyl-2,4-diamino,1,3,5-traizine, 3,5-diaminotriazole, triaminopyrimidine,2-mercapto-4,6-diamino-pyrimidine, 3,4,6-tris(ethylamino)-1,3,5-triazine, tris(alkoxycarbonylamino)triazine, N,N,N',N'-tetramethoxymethylurea and the like.

Other possible crosslinking agents include: 2,6-bis(hydroxymethyl)-p-cresol and compounds having the following structures:

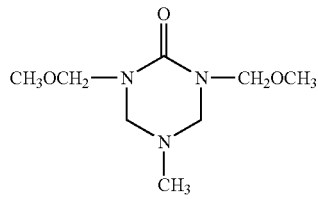

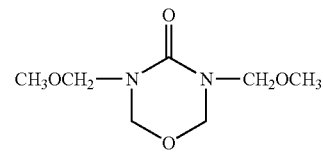

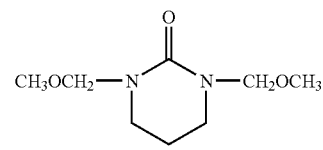

including their analogs and derivatives, such as those found in Japanese Laid-Open Patent Application (Kokai) No.1-293339 to Tosoh, as well as etherified amino resins, for example methylated or butylated melamine resins (N-methoxymethyl- or N-butoxymethyl-melamine respectively) or methylated/butylated glycolurils, for example as can be found in Canadian Patent No. 1 204 547 to Ciba Specialty Chemicals. Other examples include, for example, N,N,N,N-tetrahydroxymethylglycoluril, 2,6-dihydroxymethyl-p-cresol, 2,6-dihydroxymethylphenol, 2,2',6,6'-tetrahydroxymethyl-bisphenol A, 1,4-bis[2-(2-hydroxypropyl)] benzene, and the like, etc. Other examples of crosslinking agents include those described in U.S. Pat. Nos. 4,581,321, 4,889,789, and DE-A 36 34 371, the contents of which are incorporated by reference. Various melamine and urea resins are commercially available under the Nicalacs (Sanwa Chemical Co.), Plastopal (BASF AG), or Maprenal (Clariant GmbH) tradenames.

Isocyanates can also be used as crosslinking agent and their use, structure and synthesis are well known to those of ordinary skill in the art. Examples of isocyanate crosslinking agents can be found in U.S. Pat. No. 5,733,714, the contents of which are hereby incorporated by reference.

Other crosslinking agents include a compound of the formula

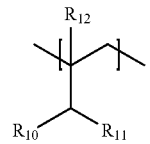

where $R_{10}$ and $R_{11}$ are each independently optionally substituted $C_{1-10}$ alkoxy; and $R_{12}$ is hydrogen or alkyl. This compound is described in U.S. Pat. No. 6,489,432, the contents of which are hereby incorporated herein by reference.

Yet another crosslinking agent includes compounds found in U.S. Pat. No. 6,319,654, the contents of which are hereby incorporated herein by reference. Examples of these compounds include:

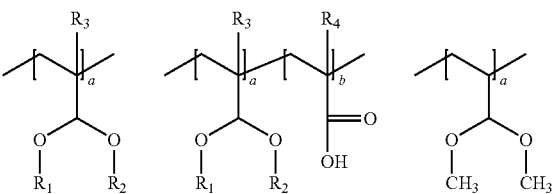

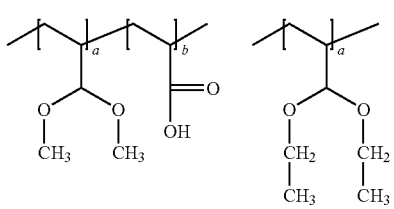

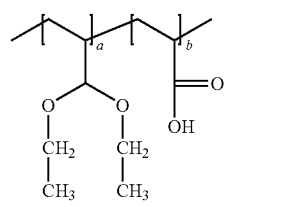

wherein, $R_1$ and $R_2$ individually represent straight or branched $C_{1-10}$ alkyl, straight or branched $C_{1-10}$ ester, straight or branched $C_{1-10}$ ketone, straight or branched $C_{1-10}$ carboxylic acid, straight or branched $C_{1-10}$ acetal, straight or branched $C_{1-10}$ alkyl including at least one hydroxyl group, straight or branched $C_{1-10}$ ester including at least one hydroxyl group, straight or branched $C_{1-10}$ ketone including at least one hydroxyl group, straight or branched $C_{1-10}$ carboxylic acid including at least one hydroxyl group, and straight or branched $C_{1-10}$ acetal including at least one hydroxyl group; and $R_3$ represents hydrogen or methyl; $R_4$ represents hydrogen or methyl; and a and b individually represent the relative amounts of each comonomer and each is a positive integer greater than 0.

Other examples found in U.S. Pat. No. 6,319,654 include

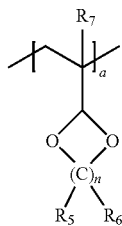

wherein, $R_5$, $R_6$ and R individually represent straight or branched $C_{1-10}$ alkyl, straight or branched $C_{1-10}$ ester, straight or branched $C_{1-10}$ ketone, straight or branched $C_{1-10}$ carboxylic acid, straight or branched $C_{1-10}$ acetal, straight or branched $C_{1-10}$ alkyl including at least one hydroxyl group, straight or branched $C_{1-10}$ ester including at least one hydroxyl group, straight or branched $C_{1-10}$ ketone including at least one hydroxyl group, straight or branched $C_{1-10}$ carboxylic acid including at least one hydroxyl group, and straight or branched $C_{1-10}$ acetal including at least one hydroxyl group; $R_7$ represents hydrogen or methyl; m represents 0 or 1; a is a positive integer greater than 0; and n represents a number of 1 to 5.

The crosslinkers can be used individually or in mixtures with each other. The crosslinking agent is added to the composition in a proportion which provides from about 0.10 to about 2.00 equivalents, preferably from about 0.50 to about 1.50, of crosslinking function per reactive group on the polymer.

The polymers useful in this invention may be prepared by any of the standard polymerization methods known in the art, examples of such methods are free radical, anionic or cationic copolymerization techniques. The polymer may be synthesized using solution, emulsion, bulk, suspension polymerization, or the like. The polymer may have various structures, such as random, block, graft, etc. The weight average molecular weight of the polymer may range from 1500 to about 50,000, preferably 4,000 to about 30,000 and more preferably 5,000 to about 20,000. When the weight average molecular weight is below 1,500, then good film forming properties are not obtained for the antireflective coating and when the weight average molecular weight is too high, then properties such as solubility, storage stability and the like may be compromised.

Examples of thermal acid generators include, but are not limited to, nitrobenzyl esters, benzoin tosylate, 2-nitrobenzyl tosylate, tris(2,3-dibromopropyl)-1,3,5-triazine-2,4,6-trione, the alkyl esters of organic sulfonic acids, p-toluenesulfonic acid, dodecylbenzenesulfonic acid, oxalic acid, phthalic acid, phosphoric acid, camphorsulfonic acid, 2,4,6-trimethylbenzene sulfonic acid, triisopropylnaphthalene sulfonic acid, 5-nitro-o-toluene sulfonic acid, 5-sulfosalicylic acid, 2,5-dimethylbenzene sulfonic acid, 2-nitrobenzene sulfonic acid, 3-chlorobenzene sulfonic acid, 3-bromobenzene sulfonic acid, 2-fluorocaprylnaphthalene sulfonic acid, dodecylbenzene sulfonic acid, 1-naphthol-5-sulfonic acid, 2-methoxy-4-hydroxy-5-benzoyl-benzene sulfonic acid, and their salts, and mixtures thereof. Other general examples of thermal acid generators include dodecylbenzenesulfonic acid triethylamine salt, dodecylbenzenedisulfonic acid triethylamine salt, sulfonate salts, such as carbocyclic aryl (e.g. phenyl, napthyl, anthracenyl, etc.), heteroaryl (e.g. thienyl) or aliphatic sulfonate salts, preferably carbocyclic aryl sulfonate salts, optionally substituted benzenesulfonate salts, etc. The carbocyclic aryl sulfonate salts can be unsubstituted or substituted by, for example, one or more of hydroxy; optionally substituted alkyl; optionally substituted alkenyl; optionally substituted alkoxy; optionally substituted carbocyclic aryl e.g. optionally substituted phenyl, optionally substituted naphthyl, optionally substituted anthracene and the like; optionally substituted aralkyl such as aralkyl e.g. optionally substituted benzyl and the like; and optionally substituted heteroaromatic or heteroalicyclic groups preferably having 1 to 3 rings, 3 to 8 ring members in each ring and from 1 to 3 heteroatoms such as coumarinyl, quinolinyl, pyridyl, pyrazinyl, pyrimidyl, furyl, pyrrolyl, thienyl, thiazolyl, oxazolyl, imidazolyl, indolyl, benzofuranyl, benzothiazol, tetrahydrofuranyl, tetrahydropyranyl, piperdinyl, morpholino, and pyrrolindinyl; etc.

Examples of cations which can be used to form the thermal acid generator salts from the above acids include 1,8-diazabicyclo[5.4.0]undec-7-ene (DBU), 1,5-diazabicyclo[4.3.0]non-5-ene (DBN), 1,4-diazabicyclo[2.2.2]octane (DABCO), tetramethylguanidine (TMG), N-dimethylaminopropyl ethyl ether, bis(N-dimethylaminoethyl)methylamine, N-dimethylbenzylamine, N-methyl-N-dimethylaminoethylpiperazine, N-methylmorpholine, compounds having the formula $[(R_1)(R_2)(R_3)NH]^+$, where $R_1$, $R_2$, and $R_3$ are independently hydrogen or an optionally substituted alkyl, aryl, heteroalkyl, alkoxy, etc groups.

The term interaction includes the formation of covalent bonds, as well as attractive ionic bonds between the functional polymer groups and the constituents of the thermal acid generator.

Suitable solvents for such photoresists may include for example ketones such as acetone, methyl ethyl ketone, methyl isobutyl ketone, cyclohexanone, isophorone, methyl isoamyl ketone, 2-heptanone 4-hydroxy, and 4-methyl 2-pentanone; $C_1$ to $C_{10}$ aliphatic alcohols such as methanol, ethanol, and propanol; aromatic group containing-alcohols such as benzyl alcohol; cyclic carbonates such as ethylene carbonate and propylene carbonate; aliphatic or aromatic hydrocarbons (for example, hexane, toluene, xylene, etc and the like); cyclic ethers, such as dioxane and tetrahydrofuran; ethylene glycol; propylene glycol; hexylene glycol; ethylene glycol monoalkylethers such as ethylene glycol monomethylether, ethylene glycol monoethylether; ethylene glycol alkylether acetates such as methylcellosolve acetate and ethylcellosolve acetate; ethylene glycol dialkylethers such as ethylene glycol dimethylether, ethylene glycol diethylether, ethylene glycol methylethylether, diethylene glycol monoalkylethers such as diethylene glycol monomethylether, diethylene glycol monoethylether, and diethylene glycol dimethylether; propylene glycol monoalkylethers such as propylene glycol methylether, propylene glycol ethylether, propylene glycol propylether, and propylene glycol butylether; propylene glycol alkyletheracetates such as propylene glycol methylether acetate, propylene glycol ethylether acetate, propylene glycol propylether acetate, and propylene glycol butylether acetate; propylene glycol alkyletherpropionates such as propylene glycol methyletherpropionate, propylene glycol ethyletherpropionate, propylene glycol propyletherpropionate, and propylene glycol butyletherpropionate; 2-methoxyethyl ether (diglyme); solvents that have both ether and hydroxy moieties such as methoxy butanol, ethoxy butanol, methoxy propanol, and ethoxy propanol; esters such as methyl acetate, ethyl acetate, propyl acetate, and butyl acetate methyl-pyruvate, ethyl pyruvate; methyl 2-hydroxy propionate, methyl 2-hydroxy 2-methyl propionate, ethyl 2-hydroxy 2-methyl propionate, methyl hydroxy acetate, ethyl hydroxy acetate, butyl hydroxy acetate, methyl lactate, ethyl lactate, propyl lactate, butyl lactate, methyl 3-hydroxy propionate, ethyl 3-hydroxy propionate, propyl 3-hydroxy propionate, butyl 3-hydroxy propionate, methyl 2-hydroxy 3-methyl butanoic acid, methyl methoxy acetate, ethyl methoxy acetate, propyl methoxy acetate, butyl methoxy acetate, methyl ethoxy acetate, ethyl ethoxy acetate, propyl ethoxy acetate, butyl ethoxy acetate, methyl propoxy acetate, ethyl propoxy acetate, propyl propoxy acetate, butyl propoxy acetate, methyl butoxy acetate, ethyl butoxy acetate, propyl butoxy acetate, butyl butoxy acetate, methyl 2-methoxy propionate, ethyl 2-methoxy propionate, propyl 2-methoxy propionate, butyl 2-methoxy propionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate, and butyl 3-butoxypropionate; oxyisobutyric acid esters, for example, methyl-2-hydroxyisobutyrate, methyl α-methoxyisobutyrate, ethyl methoxyisobutyrate, methyl α-ethoxyisobutyrate, ethyl α-ethoxyisobutyrate, methyl β-methoxyisobutyrate, ethyl β-methoxyisobutyrate, methyl β-ethoxyisobutyrate, ethyl β-ethoxyisobutyrate, methyl β-isopropoxyisobutyrate, ethyl β-isopropoxyisobutyrate, isopropyl β-isopropoxyisobutyrate, butyl β-isopropoxyisobutyrate, methyl β-butoxyisobutyrate, ethyl β-butoxyisobutyrate, butyl β-butoxyisobutyrate, methyl α-hydroxyisobutyrate, ethyl α-hydroxyisobutyrate, isopropyl α-hydroxyisobutyrate, and butyl α-hydroxyisobutyrate; solvents that have both ether and hydroxy moieties such as methoxy butanol, ethoxy butanol, methoxy propanol, and ethoxy propanol; and other solvents such as dibasic esters, and gamma-butyrolactone.; a ketone ether derivative such as diacetone alcohol methyl ether; a ketone alcohol derivative such as acetol or diacetone alcohol; lactones such as butyrolactone; an amide derivative such as dimethylacetamide or dimethylformamide, anisole, and mixtures thereof.

Since the composition is coated on top of the substrate and is further subjected to dry etching, it is envisioned that the composition is of sufficiently low metal ion level and purity that the properties of the semiconductor device are not adversely affected. Treatments such as passing a solution antireflective coating composition through an ion exchange column, filtration, and extraction processes can be used to reduce the concentration of metal ions and to reduce particles.

The coating composition can be coated on the substrate using techniques well known to those skilled in the art, such as dipping, spincoating or spraying. The film thickness of the anti-reflective coating ranges from about 0.01 μm to about 1 μm. The coating can be heated on a hot plate or convection oven or other well known heating methods to remove any residual solvent and induce crosslinking if desired, and insolubilizing the anti-reflective coatings to prevent intermixing between the anti-reflective coating and the photoresist.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying surface is uncovered.

Negative working photoresist and positive working photoresist compositions and their use are well known to those skilled in the art.

A process of the instant invention comprises coating a substrate with a coating composition of the present invention and heating the substrate on a hotplate or convection oven or other well known heating methods at a sufficient temperature for sufficient length of time to remove the coating solvent, and crosslink the polymer if necessary, to a sufficient extent so that the coating is not soluble in the coating solution of a photoresist or in a aqueous alkaline developer. An edge bead remover may be applied to clean the edges of the substrate using processes well known in the art. The heating ranges in temperature from about 70° C. to about 250° C. If the temperature is below 70° C. then insufficient loss of solvent or insufficient amount of crosslinking may take place, and at temperatures above 250° C., the polymer may become chemically unstable. A film of a photoresist composition is then coated on top of the anti-reflective coating and baked to substantially remove the photoresist solvent. The photoresist is image-wise exposed and developed in an aqueous developer to remove the treated resist. An optional heating step can be incorporated into the process prior to development and after exposure. The process of coating and imaging photoresists is well known to those skilled in the art and is optimized for the specific type of resist used. The patterned substrate can then be dry etched in a suitable etch chamber to remove the exposed portions of the anti-reflective film, with the remaining photoresist acting as an etch mask.

The following examples provide illustrations of the methods of producing and utilizing the present invention. These examples are not intended, however, to limit or restrict the scope of the invention in any way and should not be construed as providing conditions, parameters or values which must be utilized exclusively in order to practice the present invention. Unless otherwise specified, all parts and percents are by weight.

Preparation of Thermal Acid Generators

EXAMPLE A

Triethyl Ammonium Dodecylbenzene Sulfonate

In a 200 mL round bottom flask was added dodecylbenzenesulfonic acid (6.52 g, 0.020 moles), triethyl amine (2.2 g, 0.022 moles) and ether (40 mL). The ether was stripped off using a Rotovap and the remaining solids were vacuum dried. Structure was confirmed by NMR.

EXAMPLE B

N,N,N,N-Tetramethyl-diaminomethane Ammonium Para-toluene Sulfonate

In a 200 mL round bottom flask was added N,N,N,N-tetramethyl-diaminomethane (5 g, 0.049 moles), para-toluene sulfonic acid monohydrate (19 g, 0.1 moles) and ether (30 mL). The solution was mixed for 1 hour and then allowed to stand overnight at room temperature. The ether solvent was then stripped off using a Rotovap and the remaining solid was vacuum dried overnight at 50° C. Structure was confirmed by NMR.

EXAMPLE C

1,4-Diazobicyclo[2,2,2]octane ammonium 2-mesitylenesulfonate

In a 200 mL round bottom flask was added 1,4-diazobicyclo[2,2,2]octane (2.8 g, 0.025 moles), 2-mesitylenesulfonic acid (5.95 g, 0.025 moles) and ether (40 mL). The solution was mixed overnight at room temperature. The ether solvent was then stripped off using a Rotovap and the remaining solid was vacuum dried overnight at 50° C. Structure was confirmed by NMR.

EXAMPLE D

1,4-Diazobicyclo[2 2,2]octane ammonium bis (2-mesitylenesulfonate

In a 200 mL round bottom flask was added 1,4-diazobicyclo(2,2,2)octane (1.4 g, 0.0125 moles), 2-mesitylenesulfonic acid (5.95 g, 0.025 moles) and tetrahydrofuran (40 mL). The solution was mixed overnight at room temperature. The ether solvent was then stripped off using a Rotovap and the remaining solid was vacuum dried overnight at 50° C. Structure was confirmed by NMR.

EXAMPLE E

Bis triethylammonium 1,5-dinaphthalenesulfonate

In a 200 mL round bottom flask was added triethyl amine (5, 0.05 moles) 1,5-dinaphthalenesulfonic acid tetrahydrate (9.0 g, 0.025 moles) and THF (100 mL). The solution was mixed overnight at room temperature. The ether solvent was then stripped off using a Rotovap and the remaining solid was vacuum dried overnight at room temperature. Structure was confirmed by NMR.

EXAMPLE F

4,5-Dimethoxy-2-nitrobenzyl ester of 2-mesitylenesulfonic acid

In a 200 mL round bottom flask was added 4,5-dimethoxy-2-nitrobenzyl alcohol (21.8 g, 0.102 moles), 2-mesitylenesulfonyl chloride (21.3 g, 0.097 moles) and tetrahydropyran (100 mL). To this solution was added triethyl amine (10.1 g, 0.1 moles). The solution was allowed to react for 2 hours at room temperature and then quenched by adding to the reaction mixture 200 mL of DI water. The mixture was then filtered and the remaining solids were vacuum dried overnight at 50° C. The dried material was then recrystallized using THF and hexane. Structure was confirmed by NMR.

EXAMPLE G

4,5-Dimethoxy-2-nitrobenzyl ester of 4-acetylbenzenesulfonic acid

In a 200 mL round bottom flask was added 4,5-dimethoxy-2-nitrobenzyl alcohol (10.9 g, 0.051 moles), 4-acetylbenzenesulfonyl chloride (10.7 g, 0.049 moles) and tetrahydropyran (150 mL). To this solution was added triethyl amine (6 g, 0.06 moles). The solution was allowed to react for 2 hours at room temperature and then quenched by adding to the reaction mixture 500 mL of DI water. The mixture was then filtered. The remaining solids were recrystallized with acetone/ether and vacuum dried. Structure was confirmed by NMR.

EXAMPLE 1

Samples of various thermal acid generators (TAG) were evaluated on a Perkin Elmer thermogravimetric analyzer (TGA) to determine percent weight loss of the thermal acid generators on heating from room temperature (about 25° C.) to 200° C. at a rate of 10° C./minute. The data are shown in Table 1.

TABLE 1

Percent Weight Loss from Heating to 200° C. as Determined by TGA

| TAG from Example | % Wt Loss |
| --- | --- |
| A | 93.5 |
| B | 92 |
| C | 99.9 |
| D | 99.9 |
| E | 99.1 |

As these thermal acid generators are heated, some of the thermal acid generator decomposes into acid and some is left as an amine. The potentially free liberated amine can bond ionically with functional groups on the polymer, making the thermal acid generator even less volatile. An additional benefit is seen in the comparison of TAG B with TAGs C and D. The difference between TAGs is the amine used. TAGs C and D uses a very strong base versus a weaker base used in TAG B. This suggests a benefit of using strong bases in the TAGs.

EXAMPLE 2

An antireflective coating composition containing poly(hydroxystyrene/methyl methacrylate), glycoluril crosslinker, and solvent was prepared and to aliquots of the composition were added the TAGs (10% of a ten percent solution of TAG in solvent, based on the solid weight of poly(hydroxystyrene/methyl methacrylate) as shown in Table II below. Samples of the TAG containing aliquots were spin coated on a silicon wafer, baked for 60 seconds at either 130° C. or 200° C., and then soaked in PGMEA for 60 seconds. Wafers were rated pass or fail, depending on whether coating was removed after PGMEA soaking.

TABLE II

Crosslinking Studies of Various TAGs at 130° C. and 200° C.

| TAG from Example | 130° C. | 200° C. |
| --- | --- | --- |
| A | FAIL | PASS |
| B | FAIL | PASS |

TABLE II-continued

Crosslinking Studies of Various TAGs at 130° C. and 200° C.

| TAG from Example | 130° C. | 200° C. |
|---|---|---|
| C | FAIL | PASS |
| D | FAIL | PASS |
| E | FAIL | PASS |

These data indicate that these TAGs require a minimum soft bake of 200° C./60 sec to be crosslinked.

EXAMPLE 3

Weight loss of a sample of poly(hydroxystyrene/methyl methacrylate) ("PHS/MMA") with a TAG was evaluated using thermogravimetric analysis (heating to 2000 at 10° C./min). The results are shown in Table III.

TABLE III

| MATERIAL | % TGA Wt Loss | |
|---|---|---|
| | % WT LOSS AT 200° C. | CORRECTED WT LOSS AT 200° C.* |
| PHS/MMA | 1.5 | |
| TAG F with PHS/MMA | 17 | 31 |
| TAG F alone | 42** | |
| TAG G with PHS/MMA | 7 | 11 |
| TAG G alone | 31** | |

*The correction is both for the dilution as well as the weight loss coming from the PHS/MMA
**This value was for undiluted TAG F or G Looking at Table III, it is readily suggested that significant decrease in weight loss occurs from the PHS/MMA polymer providing a source for either part of the TAG to bind to the polymer.

EXAMPLE 4

Crosslinking studies following the protocol in Example 2 were done on TAGs F and G, with an additional bake temperature at 120° C., 130° C., and 200° C. The data are shown in Table IV.

TABLE IV

| Crosslinking Studies of TAGs F and G at 130° C. and 200° C. | | | |
|---|---|---|---|
| TAG from Example | 120° C. | 130 C. | 200° C. |
| G | | PASS | PASS |
| F | PASS | | PASS |
| A | | FAIL | PASS |

TAGs F and G not only crosslink well at 200° C. but also crosslink as low as 120° C. In comparison, a classical TAG A will not crosslink the resin until 200° C.

The invention claimed is:

1. A method for reducing outgassing from an antireflective coating film comprising applying to a substrate an antireflective coating composition comprising (a) a polymer comprising one or more functional groups capable of one or more interactions selected from the group consisting of covalent bonding, ionic bonding, and hydrogen bonding; and (b) a thermal acid generator which upon heating disassociates into constituent parts that are capable of one or more interactions selected from the group consisting of covalent bonding, ionic bonding, and hydrogen bonding; and heating the antireflective coating composition to form the antireflective coating film on the substrate, the constituent parts of the thermal acid generator becoming bound to the functional groups of the polymer through the interactions, reducing outgassing from the antireflective coating film, where the polymer comprises a hydroxyl group and a chromophore group, and the thermal acid generator is selected from the group consisting of 1,4-Diazobicyclo[2,2,2]octane ammonium 2-mesitylenesulfonate, 1,4-Diazobicyclo[2,2,2]octane ammonium bis (2-mesitylenesulfonate), 4,5-Dimethoxy-2-nitrobenzyl ester of 2-mesitylenesulfonic acid and 4,5-Dimethoxy-2-nitrobenzyl ester of 4-acetylbenzenesulfonic acid.

2. The method of claim 1, wherein the polymer contains at least one monomer is selected from the group consisting of optionally substituted acrylic esters, optionally substituted acrylic acids, optionally substituted methacrylic esters, optionally substituted methacrylic acids, optionally substituted acrylamides, optionally substituted methacrylamides, optionally substituted allyl compounds, optionally substituted styrenes, optionally substituted hydroxystyrene, optionally substituted hydroxyisopropylstyrene, optionally substituted methylstyrene, optionally substituted hydroxymethylstyrene, optionally substituted hydroxyl-alpha-methylstyrene, optionally substituted vinyl ethers, optionally substituted vinyl esters, optionally substituted crotonic acids, optionally substituted crotonic acid esters, optionally substituted maleic anhydride, optionally substituted dialkyl itaconates, optionally substituted monoalkyl or dialkyl esters of maleic acid or fumaric acid, and mixtures thereof.

3. An antireflective coating composition comprising a polymer comprising a hydroxyl group and a chromophore group, and a thermal acid generator selected from the group consisting of 1,4-Diazobicyclo[2,2,2]octane ammonium 2-mesitylenesulfonate and 1,4-Diazobicyclo[2,2,2]octane ammonium bis (2-mesitylenesulfonate).

4. An antireflective coating composition comprising a polymer comprising a hydroxyl group and a chromophore group, and a thermal acid generator selected from the group consisting of 4,5-Dimethoxy-2-nitrobenzyl ester of 2-mesitylenesulfonic acid and 4,5-Dimethoxy-2-nitrobenzyl ester of 4-acetylbenzenesulfonic acid.

* * * * *